(12) United States Patent
Ono et al.

(10) Patent No.: US 9,279,848 B2
(45) Date of Patent: Mar. 8, 2016

(54) TEST APPARATUS

(71) Applicant: Sumitomo Electric Device Innovations, Inc., Yokohama-shi (JP)

(72) Inventors: Haruyoshi Ono, Yokohama (JP); Isao Baba, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 14/466,719

(22) Filed: Aug. 22, 2014

(65) Prior Publication Data

US 2015/0055131 A1    Feb. 26, 2015

(30) Foreign Application Priority Data

Aug. 22, 2013   (JP) ................................ 2013-172654

(51) Int. Cl.
   *G01M 11/02*    (2006.01)
   *G01R 31/26*    (2014.01)
   *H01S 5/00*     (2006.01)

(52) U.S. Cl.
   CPC ........... *G01R 31/2635* (2013.01); *H01S 5/0014* (2013.01)

(58) Field of Classification Search
   USPC ........ 356/73.1; 324/750.02, 764.01; 702/118; 73/1.01
   See application file for complete search history.

(56) References Cited

U.S. PATENT DOCUMENTS

| | | | |
|---|---|---|---|
| 2004/0255213 A1* | 12/2004 | Moessinger et al. | 714/729 |
| 2005/0093674 A1* | 5/2005 | Wackerl et al. | 340/5.8 |
| 2005/0265717 A1* | 12/2005 | Zhou | 398/9 |
| 2006/0115199 A1* | 6/2006 | Yao | 385/11 |
| 2007/0171399 A1* | 7/2007 | Froggatt | 356/73.1 |
| 2011/0131000 A1* | 6/2011 | Daub et al. | 702/118 |
| 2011/0252860 A1* | 10/2011 | Ono et al. | 73/1.01 |
| 2013/0200913 A1* | 8/2013 | Panagas | 324/756.02 |
| 2014/0071436 A1* | 3/2014 | Cyr et al. | 356/73.1 |

FOREIGN PATENT DOCUMENTS

JP        2007-271588 A      10/2007

* cited by examiner

*Primary Examiner* — Sang Nguyen
(74) *Attorney, Agent, or Firm* — Venable LLP; Michael A. Sartori; Todd R. Farnsworth

(57) ABSTRACT

Disclosed is a test apparatus including: test target sections each having a connector to connect a Device Under the Test (DUT); measuring sections that include measuring devices that have same measuring item respectively; a switch section that switches connection between the test target section and the measuring section under direction of a controller; wherein the controller selects one of the algorithms of connection, 1) searching vacancy of the measuring sections and directs the switch section to make a path between the test target section and the measuring section of vacancy, 2) holding the path that former selected.

5 Claims, 10 Drawing Sheets

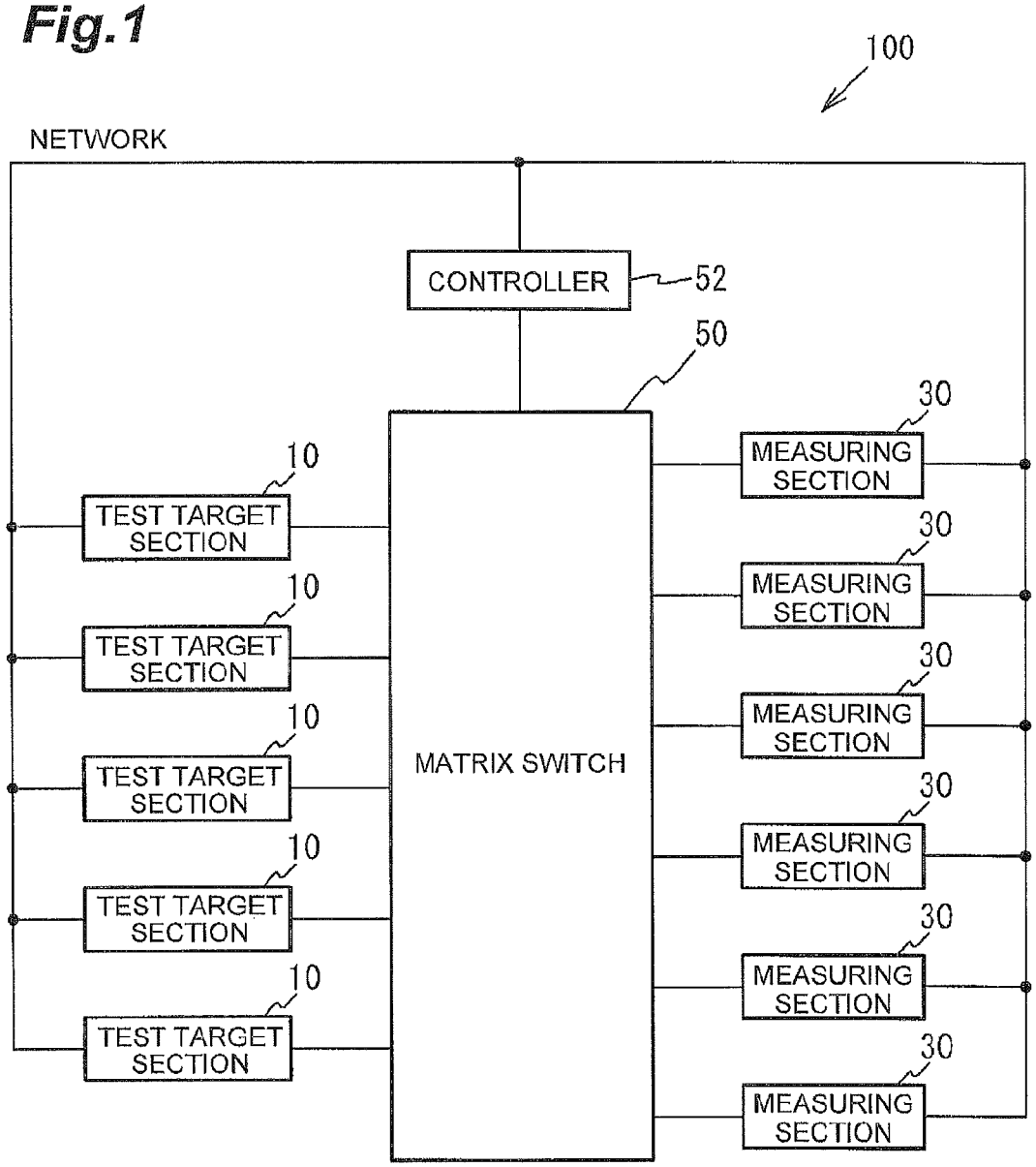

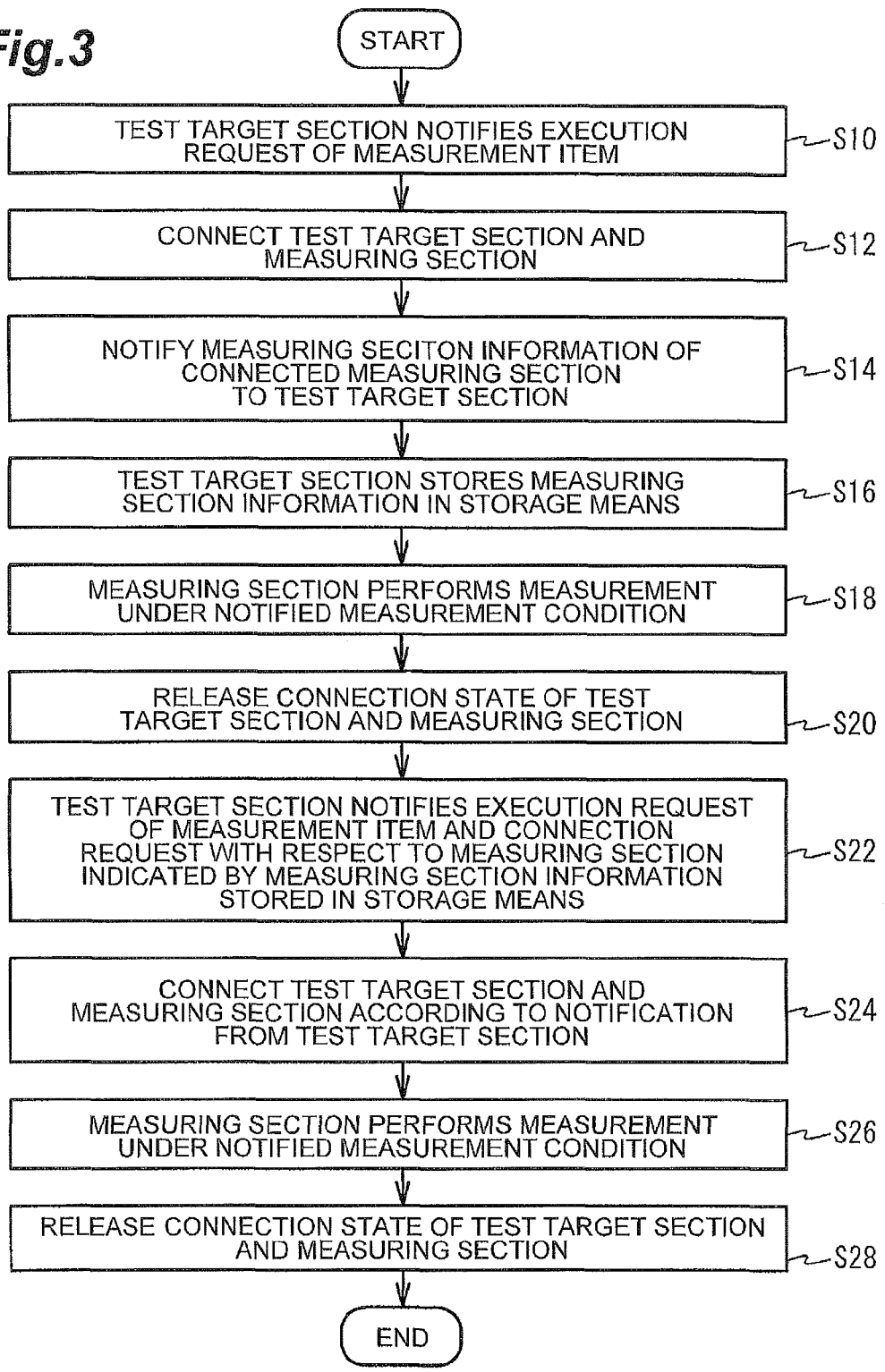

*Fig.6A*

|   | RESERVATION TABLE | CONNECTION PRIORITY | CONNECTION REQUEST TIME |
|---|---|---|---|
| 1 | TEST TARGET SECTION D | 1 | XX:XX:XX.XX |
| 2 | TEST TARGET SECTION C | 2 | XX:XX:XX.XX |
| 3 | TEST TARGET SECTION A | 3 | XX:XX:XX.XX |
| 4 | TEST TARGET SECTION B | 4 | XX:XX:XX.XX |
| 5 |   |   |   |
| 6 |   |   |   |

*Fig.6B*

|   | RESERVATION TABLE | CONNECTION PRIORITY | CONNECTION REQUEST TIME |
|---|---|---|---|
| 1 | TEST TARGET SECTION D | 2 | XX:XX:XX.XX |
| 2 | TEST TARGET SECTION C | 3 | XX:XX:XX.XX |
| 3 | TEST TARGET SECTION A | 1 | XX:XX:XX.XX |
| 4 | TEST TARGET SECTION B | 4 | XX:XX:XX.XX |
| 5 |   |   |   |
| 6 |   |   |   |

TEST APPARATUS

BACKGROUND OF THE INVENTION

1. Field of the Invention

An aspect of the present invention relates to a test apparatus, and for example, to a test apparatus in which a test target section is connected to plural measuring sections by a switch section.

2. Related Background Art

As a test apparatus that measures a characteristic of an object to be tested (DUT: Device Under the Test) such as a semiconductor laser, a network type test apparatus in which plural test target sections that include the object to be tested and plural measuring sections are connected to each other by a switch section is known (for example, see Japanese Unexamined Patent Application Publication No. 2007-271588)

SUMMARY OF THE INVENTION

Since an apparatus used for measurement of the object to be tested such as a semiconductor laser is very expensive, it is desirable to efficiently use the apparatus. In the network type test apparatus, since the test target section may be connected to the measuring section that is not operated, among the plural measuring sections, it is possible to enhance the operation efficiency of the measuring sections. However, in a case where the plural measuring sections having the same function are present, when the same item is measured for one test target section plural times, the measurement may be performed by different measuring sections. Thus, it is difficult to perform the measurement with high accuracy.

According to an aspect of the invention, an object of the invention is to provide a test apparatus capable of enhancing the accuracy of measurement.

According to an aspect of the invention, there is provided a test apparatus including: test target sections each having a connector to connect a Device Under the Test (DUT), measuring sections that include measuring devices that have same measuring item respectively, a switch section that switches connection between the test target section and the measuring section under direction of a controller, wherein the controller selects one of the algorithms of connection, 1) searching vacancy of the measuring sections and directs the switch section to make a path between the test target section and the measuring section of vacancy, 2) holding the path that former selected.

According to the aspect of the invention, it is possible to enhance the accuracy of measurement.

BRIEF DESCRIPTION OF THE DRAWINGS

FIG. 1 is a block diagram illustrating an entire configuration of a test apparatus according to a first embodiment.

FIG. 3 is a flowchart illustrating an example of a control method of the test apparatus according to the first embodiment.

FIG. 6A illustrates an example of a table stored in storage means.

FIG. 6B illustrates an example of a table stored in storage means.

DESCRIPTION OF THE PREFERRED EMBODIMENTS

Description of Embodiments

Figure 2A:
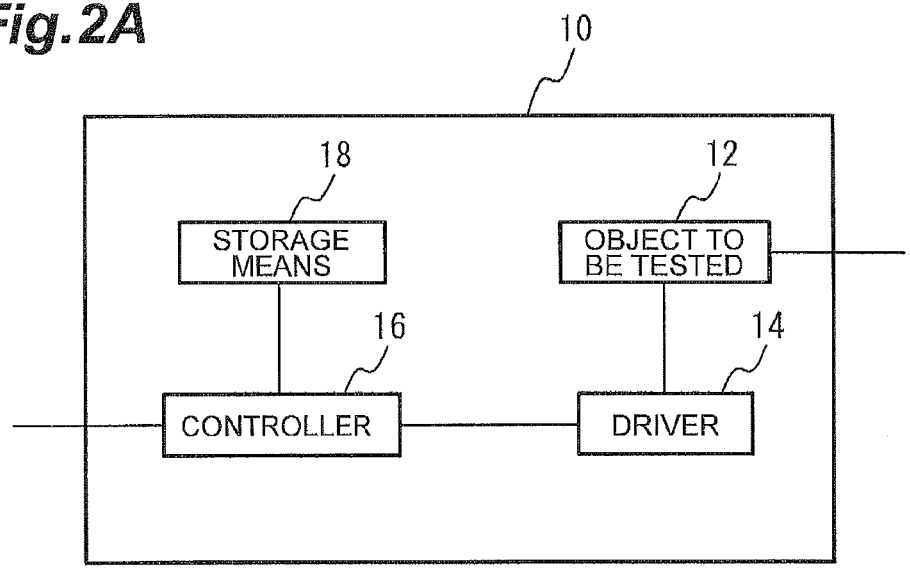
FIG. 2A is a block diagram illustrating details of a test target section.

First, an embodiment of a test apparatus according to an aspect of the invention will be enumerated for description.

A test apparatus according to an embodiment includes: test target sections each having a connector to connect a Device Under the Test (DUT); measuring sections that include measuring devices that have same measuring item respectively; a switch section that switches connection between the test target section and the measuring section under direction of a controller; wherein the controller selects one of the algorithms of connection, 1) searching vacancy of the measuring sections and directs the switch section to make a path between the test target section and the measuring section of vacancy, 2) holding the path that former selected.

In the test apparatus according to the aspect of the invention, the controller selects the algorithm 2) when the measuring section measures output of the DUT under different temperature.

In the test apparatus according to the aspect of the invention, the measuring item includes one of a bit error rate, a wavelength, and an optical power.

In the test apparatus according to the aspect of the invention, the controller selects the algorithm 2) when the measuring section measures output of the DUT under different length of the path.

In the test apparatus according to the aspect of the invention, the switch section is a matrix switch that switches connection between the plurality of test target sections and the plurality of measuring sections.

A test apparatus according to an embodiment includes: a test target section that is connected to an object to be tested; a plurality of measuring sections that includes the same measuring device; a switch section that switches connection between the test target section and the plurality of measuring sections; storage means for storing measuring section information that indicates the measuring section connected to the test target section; and a controller that performs a control for selecting, when the test target section executes again a measurement for the same object to be tested using the same measuring device as in a previous measurement, the corresponding measuring section with reference to the measuring section information stored in the storage means. According to this test apparatus, it is possible to enhance the accuracy of measurement.

In the test apparatus according to the aspect of the invention, the test target section may include temperature control means for controlling temperature of the object to be tested, and the controller may perform the control for selecting, when the test target section executes again the measurement for the same object to be tested using the same measuring device as in the previous measurement at a different temperature, the corresponding measuring section with reference to the measuring section information stored in the storage means.

In the test apparatus according to the aspect of the invention, the plurality of measuring sections may include a receiver that receives a signal for measuring a bit error rate, output from the object to be tested (DUT: Device Under the Test), a wavelength measuring device that measures a wavelength of light output from the object to be tested, or an optical power measuring device that measures power of the light.

In the test apparatus according to the aspect of the invention, the controller may perform the control for selecting, when the test target section executes again the measurement for the same object to be tested using the same measuring device as in the previous measurement through a different transmission line, the corresponding measuring section with reference to the measuring section information stored in the storage means.

Details of Embodiments

Hereinafter, an embodiment of a test apparatus according to an aspect of the invention will be described. The aspect of the invention is not limited to the following exemplary embodiments. The aspect of the invention is disclosed by claims, and is intended to include all modifications within a meaning and a scope equivalent to those of claims.

First Embodiment

FIG. 1 is a block diagram illustrating an entire configuration of a test apparatus according to a first embodiment. As shown in FIG. 1, a test apparatus 100 according to the first embodiment includes plural test target sections 10, plural measuring sections 30, a switch section 50, and a controller 52. The switch section 50 is a matrix switch, for example. The matrix switch switches connection between the plurality of test target sections 10 and the plurality of measuring sections 30. The controller 52 includes a central processing unit (CPU), a read-only memory (ROM), a random access memory (RAM), and the like, and controls the switch section 50. The switch section 50 performs switching of connection between the plural test target sections 10 and the plural measuring sections 30 according to a command of the controller 52 to change a connection combination.

Figure 2B:
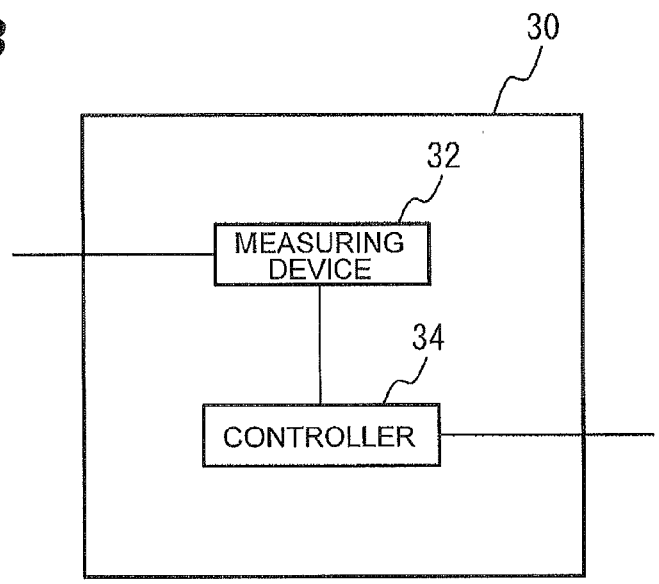
FIG. 2B is a block diagram illustrating details of a measuring section.

FIG. 2A is a block diagram illustrating details of the test target section 10, and FIG. 2B is a block diagram illustrating details of the measuring section 30. As shown in FIG. 2A, the test target section 10 includes an object to be tested 12, a driver 14, a controller 16, and storage means 18. In the first embodiment, an example in which the object to be tested 12 is a semiconductor laser will be described. The controller 16 includes a CPU, a ROM, a RAM, and the like, and controls an operation of the driver 14, notification of a connection request with respect to the measuring section 30 indicated by measuring section information stored in the storage means 18, and the like. The storage means 18 is a hard disk drive, for example. The driver 14 drives the object to be tested 12 according to a command of the controller 16. In other words, the each test target section 10 has a connector to connect the object to be tested 12 (DUT: Device Under the Test).

As shown in FIG. 2B, the measuring section 30 includes a measuring device 32, and a controller 34. In other words, measuring sections 30 include measuring devices 32 that have same measuring item respectively. The controller 34 includes a CPU, a ROM, a RAM, and the like, and controls an operation of the measuring device 32. The measuring device 32 is a device that measures a characteristic of the object to be tested 12 provided in the test target section 10 connected thereto through the switch section 50 according to a command of the controller 34. In the first embodiment, an example in which the measuring device 32 is a wavelength measuring device that measures a wavelength of laser light output from the object to be tested 12 will be described.

As shown in FIG. 1, FIGS. 2A, and 2B, the controller 16 provided in the test target section 10, the controller 34 provided in the measuring section 30, and the controller 52 are connected to each other through a network.

Next, a control method of the test apparatus 100 according to the first embodiment will be described. FIG. 3 is a flowchart illustrating an example of the control method of the test apparatus 100 according to the first embodiment. As shown in FIG. 3, the controller 16 of the test target section 10 notifies the controller 52 of an execution request of measurement of a wavelength that is a measurement item (step S10). The controller 52 controls the switch section 50 based on the execution request of the wavelength measurement notified from the test target section 10, and connects the test target section 10 to a free measuring section 30 (i.e. the measuring section 30 of vacancy) capable of performing the wavelength measurement, among the plural measuring sections 30 (step S12).

The controller 52 notifies the test target section 10 of the measuring section information that indicates the connected measuring section 30 (step S14). The measuring section information refers to information capable of specifying the measuring section 30, such as a unit number of the measuring section 30, for example. The controller 16 of the test target section 10 stores the measuring section information provided from the controller 52 in the storage means 18 (step S16).

The controller 16 of the test target section 10 gives a command to the driver 14 to drive the object to be tested 12 under a predetermined condition, and notifies the controller 34 of the measuring section 30 of a measurement condition and a measurement start. The controller 34 of the measuring section 30 controls the measuring device 32 according to the measurement condition notified from the controller 16 of the test target section 10 to perform a first measurement (step S18).

After the first measurement is finished, the controller 34 of the measuring section 30 notifies the controller 16 of the test target section 10 of a measurement result and a measurement finish. The controller 16 of the test target section 10 receives the notification of the measurement finish, and notifies the controller 52 of the measurement finish. The controller 52 receives the notification of the measurement finish, and controls the switch section 50 to release the connection state of the test target section 10 and the measuring section 30 (step S20).

Thereafter, when the wavelength measurement of laser light output from the object to be tested 12 provided in the test target section 10 is performed again, the controller 16 of the test target section 10 notifies the controller 52 of an execution request of measurement of a wavelength that is a measurement item and a connection request with respect to the measuring section 30 indicated by the measuring section information stored in the storage means 18 (step S22).

The controller 52 controls the switch section 50 according to the connection request from the test target section 10, selects the measuring section 30 indicated by the measuring section information, and connects the test target section 10 to the selected measuring section 30 (step S24). The controller 16 of the test target section 10 gives a command to the driver 14 to drive the object to be tested 12 under a predetermined condition, and notifies the controller 34 of the measuring section 30 of a measurement condition and a measurement start. The controller 34 of the measuring section 30 controls the measuring device 32 under the measurement condition notified from the controller 16 of the test target section 10 to perform a second measurement (step S26).

After the second measurement is finished, the controller 34 of the measuring section 30 notifies the controller 16 of the test target section 10 of a measurement result and a measurement finish. The controller 16 of the test target section 10 receives the notification of the measurement finish, and notifies the controller 52 of the measurement finish. The controller 52 receives the notification of the measurement finish, and controls the switch section 50 to release the connection state of the test target section 10 and the measuring section 30 (step S28). Thereafter, steps S22 to S28 are repeated as necessary. In other words, the controller 52 selects one of the algorithms of connection, 1) searching vacancy of the measuring sections 30 and directs the switch section 50 to make a path between the test target section 10 and the measuring section 30 of vacancy, 2) holding the path that former selected.

Figure 4:
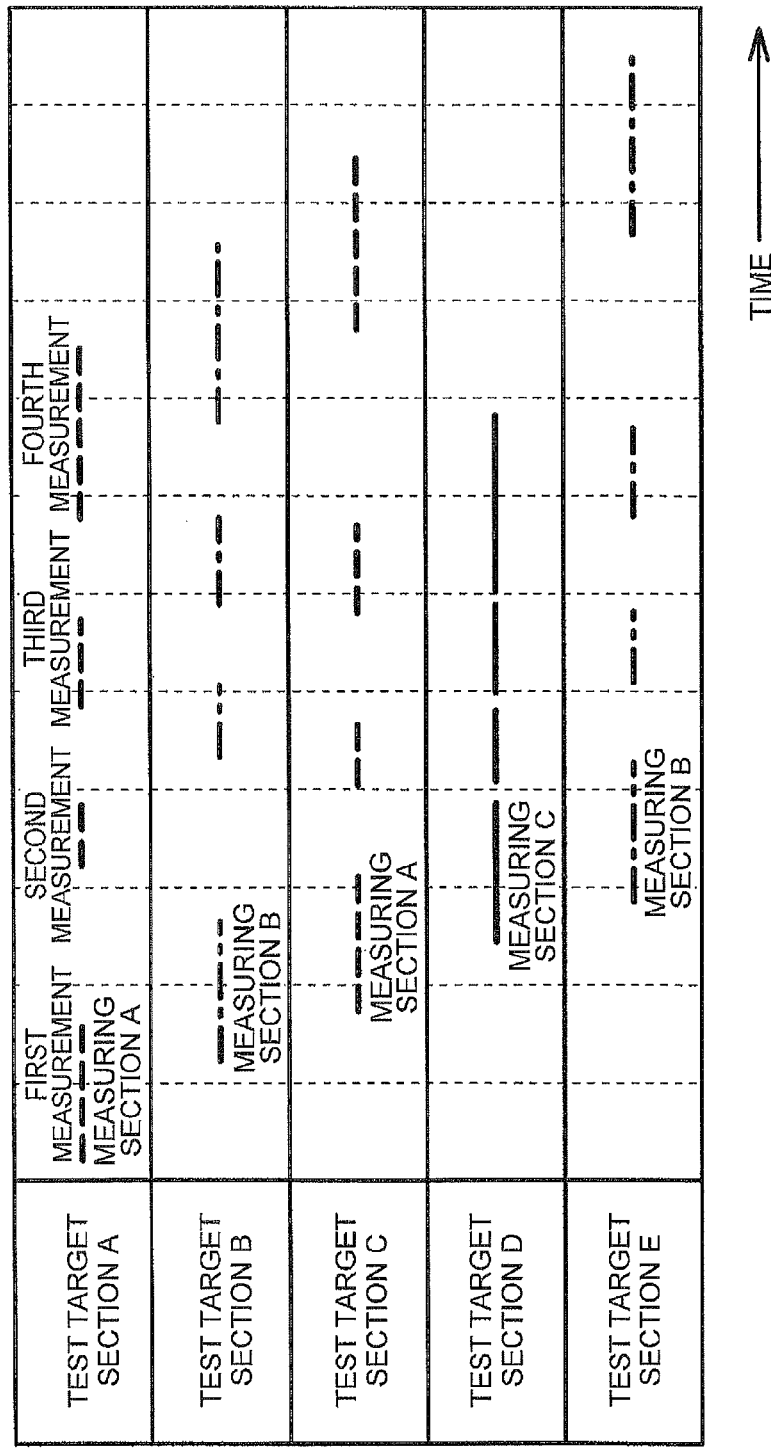
FIG. 4 illustrates an example of a timing chart for explaining a procedure shown in FIG. 3.

FIG. 4 illustrates an example of a timing chart for explaining the procedure shown in FIG. 3. In FIG. 4, measurement periods in the measuring sections A to C among the plural measuring sections 30 are respectively shown in a broken line, a single dot chain line and a solid line. As shown in FIG. 4, the test target section A among the plural test target sections 10 performs steps S10 to S18 of FIG. 3 to perform the first measurement of the wavelength of the laser light output from the object to be tested 12 using the measuring section A. The test target section B among the plural test target sections 10 also performs steps S10 to S18 of FIG. 3 to perform the first measurement of the wavelength of the laser light using the measuring section B instead of the measuring section A that is being used. Similarly, the test target section C performs the first measurement of the wavelength of the laser light using the measuring section A that is free. The test target section D performs the first measurement of the wavelength of the laser light using the measuring section C instead of the measuring sections A and B that are being used. The test target section E performs the first measurement of the wavelength of the laser light using the measuring section B that is free.

Thereafter, when the test target sections A to E perform the second to fourth measurements of the wavelength of the laser light, the test target sections A to E perform steps S22 to S28 of FIG. 3 using the measuring section indicated by the measuring section information stored in the storage means 18. That is, the test target section A performs the second to fourth measurements of the wavelength of the laser light using the measuring section A. Similarly, the test target sections B to E respectively perform the second to fourth measurements of the wavelength of the laser light using the measuring sections B, A, C and B. Thus, the test target sections A to E perform the first to fourth measurements of the wavelength of the laser light using the same measuring sections.

According to the first embodiment, the measuring section information that indicates the measuring section 30 to which the test target section 10 is connected in measurement of wavelength of laser light is stored in the storage means 18. Further, when the test target section 10 measures again the wavelength of the laser light after the connection state of the test target section 10 and the measuring section 30 is released, the test target section 10 is connected to the measuring section 30 indicated by the measuring section information stored in the storage means 18. That is, when the test target section 10 performs again the measurement for the same object to be tested 12 using the same measuring device 32 as in the previous measurement, the controller 52 performs a control for selecting the corresponding measuring section 30 with reference to the measuring section information stored in the storage means 18. Thus, even when the wavelength measurement is performed for one test target section 10 plural times, it is possible to perform the measurement using the same measuring section 30.

For example, when the wavelength measurement is performed for one test target section 10 under the same condition using three different measuring sections 30, results of 1550.165 nm, 1550.160 nm, and 1550.163 nm are obtained. In this way, when the measurement is performed using the different measuring sections 30, an individual difference (device difference) between the measuring devices 32 is included in the measurement results. Thus, when a high accuracy of measurement to such a degree that the individual difference between the measuring devices 32 is not allowable is demanded, it is difficult to cope with a case where tuning to an ITU-T wavelength in a wavelength division multiplexing (WDM) product is performed, for example. On the other hand, according to the first embodiment, since the wavelength measurement for one test target section 10 can be performed plural times using the same measuring section 30, the individual difference between the measuring devices 32 does not appear in the measurement results, to thereby making it possible to enhance the accuracy of measurement. For example, when the first measurement and the second measurement are performed under the same condition, it is possible to make the accuracy of measurement between the first measurement and the second measurement higher than the individual difference between the plural measuring sections 30.

In the first embodiment, the test target section 10 stores the measuring section information provided from the controller 52 in the storage means 18, and notifies, when performing again the wavelength measurement after the connection state of the test target section 10 and the measuring section 30 is released, the controller 52 of the connection request with respect to the measuring section 30 indicated by the measuring section information stored in the storage means 18. Further, the controller 52 controls the switch section 50 according to the connection request to connect the test target section 10 to the measuring section 30 indicated by the measuring section information. In this case, the controller 52 performs the control for selecting the corresponding measuring section 30 with reference to the measuring section information stored in the storage means 18 in an indirect manner (through the controller 16). However, the aspect of the invention is not limited to this case, and the test target section 10 may be connected to the measuring section 30 indicated by the measuring section information using a different method. For example, the measuring section information related to each of the plural test target sections 10 may be stored in the storage means, and the controller 52 may perform, when receiving the notification of the execution request of the wavelength measurement from the test target section 10, the control for selecting the corresponding measuring section 30 with reference to the measuring section information stored in the storage means in a direct manner and with reference to the measuring section information corresponding to the test target section 10 that is a notification source from the storage means. In this case, the storage means may not be provided in the test target section 10, but instead, may be provided at a different place of the test apparatus 100.

As shown in step S10 of FIG. 3, when only the execution request of the measurement item is notified from the test target section 10 and the connection request with respect to the measuring section 30 indicated by the measuring section information is not notified therefrom, the controller 52 connects the test target section 10 to a free measuring section 30 among the plural measuring sections 30. Thus, it is possible to perform the measurement for the plural test target sections 10 in parallel, to thus provide the measurement with high efficiency.

In the first embodiment, a case where the measuring device 32 included in the measuring section 30 is the wavelength measuring device that measures the wavelength of the laser light output from the object to be tested 12 that is the semiconductor laser is described as an example, the measuring device 32 may be an optical power measuring device that measures power of the laser light.

Second Embodiment

Figure 5:
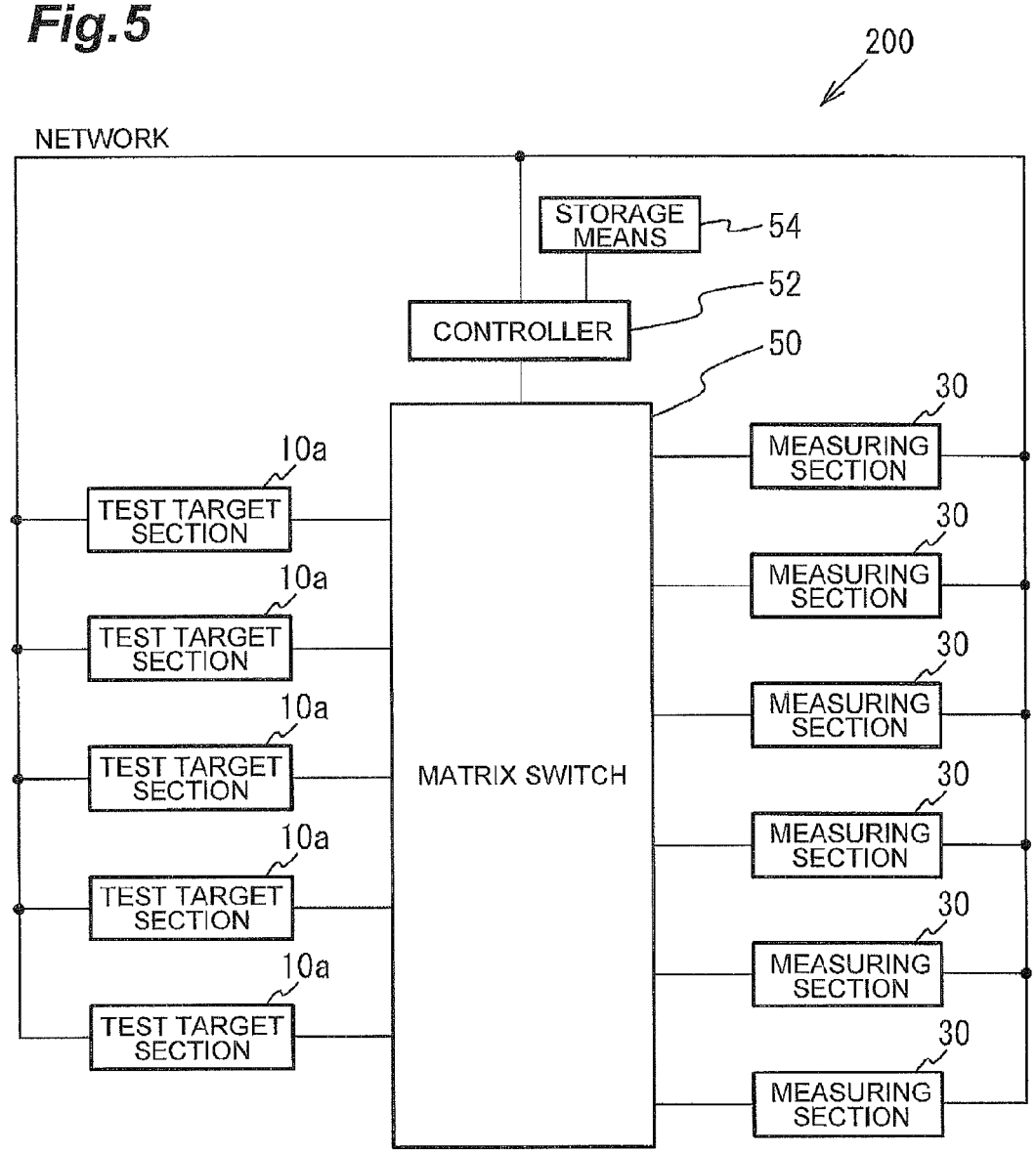
FIG. 5 is a block diagram illustrating an entire configuration of a test apparatus according to a second embodiment.

In a second embodiment, an example in which the temperature of the object to be tested 12 is changed to measure a change of the wavelength of the laser light output from the object to be tested 12 is shown. FIG. 5 is a block diagram illustrating an entire configuration of a test apparatus according to a second embodiment. As shown in FIG. 5, a test apparatus 200 according to the second embodiment further includes storage means 54. The storage means 54 is a hard disk drive, for example. The storage means 54 stores a table in which a connection order of test target sections 10a to be respectively connected to the plural measuring sections 30 is written. The controller 52 controls connection between the plural test target sections 10a and the plural measuring sections 30 according to the table. The other configuration of the second embodiment is the same as in the first embodiment shown in FIG. 1, and the description will not be repeated. Further, a control method of the test apparatus according to the second embodiment is the same as in the first embodiment shown in the flowchart of FIG. 3, and the description will not be repeated.

FIGS. 6A and 6B illustrate an example of the table stored in the storage means 54. As shown in FIG. 6A, for example, when the connection requests from the test target sections A to D in step S22 of FIG. 3 are focused on one measuring section 30 (measuring section A), the controller 52 creates a table for determining the connection priority in a notification order of the connection requests from the test target sections A to D, and stores the created table in the storage means 54. Further, the controller 52 connects the test target sections A to D and the measuring section A based on this table. Here, when the connection request from the test target section A includes a request for a top priority connection as in FIG. 6B, the controller 52 changes the table to ascend the connection priority of the test target section A so that the test target section A is preferentially connected, without depending on the notification order of the connection requests, and stores the changed table in the storage means 54.

Figure 7:
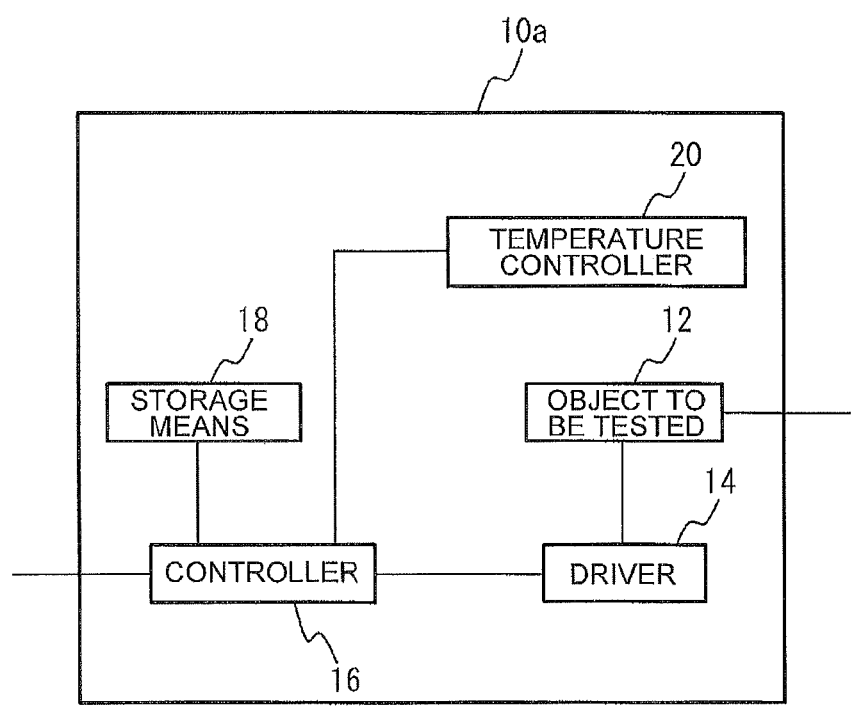
FIG. 7 is a block diagram illustrating details of a test target section.

FIG. 7 is a block diagram illustrating details of the test target section 10a. As shown in FIG. 7, the test target section 10a includes a temperature controller 20, in addition to the object to be tested 12, the driver 14, the controller 16, and the storage means 18. The temperature controller 20 controls the temperature of the object to be tested 12 under the control of the controller 16. The other configuration is the same as in the first embodiment shown in FIG. 2A, and the description will not be repeated. Further, details of the measuring section 30 are the same as in the first embodiment shown in FIG. 2B, and the description will not be repeated.

Figure 8A:
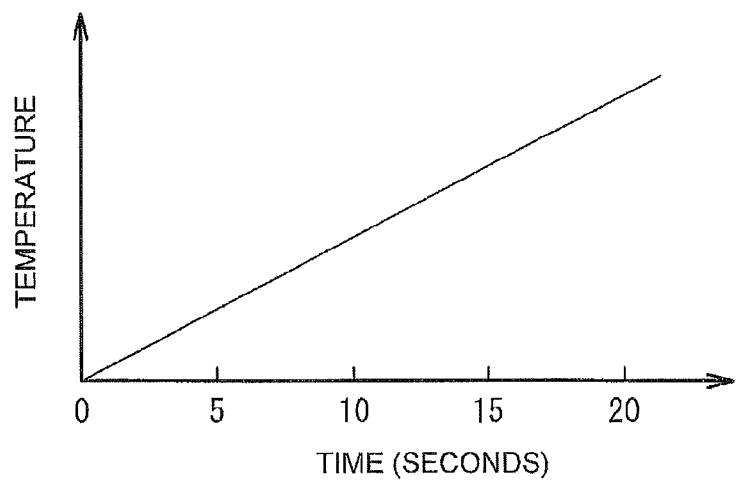
FIG. 8A is a diagram illustrating a temperature change of an object to be tested using a temperature controller.
Figure 8B:
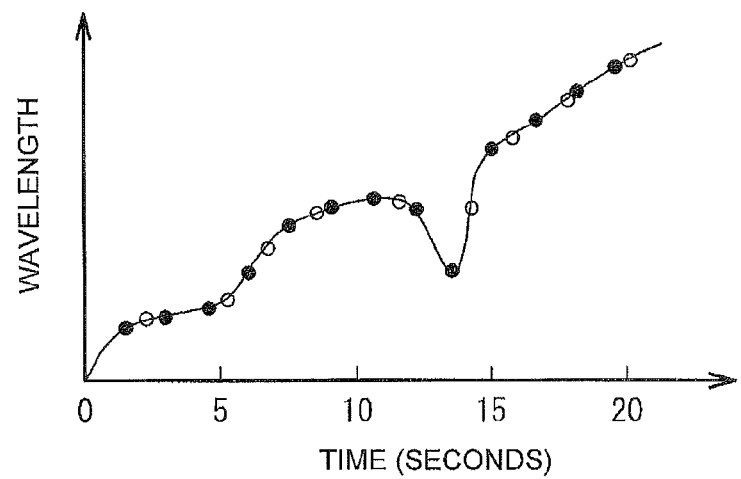
FIG. 8B is a diagram illustrating a wavelength change of laser light output from an object to be tested.

FIG. 8A is a diagram illustrating a temperature change of the object to be tested 12 using the temperature controller 20. FIG. 8B is a diagram illustrating a wavelength change of the laser light output from the object to be tested 12. As shown in FIG. 8A, it is assumed that the temperature of the object to be tested 12 is controlled to constantly increase with time by the temperature controller 20. In this case, as shown in FIG. 8B, the wavelength of the laser light measured in the measuring device 32 is shifted toward a long wavelength with time. Here, when the wavelength measurement is asynchronously performed with respect to the temperature change of the object to be tested 12, in order to measure the trace of the wavelength change with high accuracy, it is preferable to perform the measurement at a large number of measurement points.

In FIG. 8B, black circles represent measurement points when the preferential connection as described in FIGS. 6A and 6B is performed, and white circles represent measurement points when the connection is performed in the notification order of the connection requests without performing the preferential connection. In this way, by performing the preferential connection as described in FIGS. 6A and 6B for the connection of the test target section 10a and the measuring section 30, it is possible to perform the measurement at a large number of measurement points, and to obtain the trace of the wavelength change with high accuracy.

According to the second embodiment, when the connection request with respect to the measuring section 30 indicated by the measuring section information notified together with the execution request of the measurement item includes the request for the preferential connection, the controller 52 preferentially connects the test target section 10a to the measuring section 30. In this way, by preferentially connecting the test target section 10a to the measuring section 30 when the priority connection request with respect to the measuring section 30 is notified together with the execution request of the measurement item from the test target section 10a, it is possible to increase the measurement points and to measure the wavelength change with high accuracy when the wavelength measurement is asynchronously performed with respect to the temperature change, as described in FIGS. 8A and 8B. Further, it is possible to determine the preferential connection by the content of measurement, a product type, express lot processing on a manufacturing line, or the like, and thus, it is possible to efficiently perform the measurement in a dynamic and flexible manner.

In the second embodiment, an example in which the controller 52 creates the table in which the connection priority is set in principle in the notification order of the connection requests from the test target section 10a, and changes, when the connection request includes the request for the preferential connection, the table to ascend the connection priority so that the preferential connection is performed without depending on the notification order is shown. However, the aspect of the invention is not limited thereto, and the test target section 10a may be connected, when the preferential connection request is notified from the test target section 10a, to the measuring section 30 using a different method.

Further, in the second embodiment, an example in which the test target section 10a includes the temperature controller 20 that controls the temperature of the object to be tested 12 and the controller 52 performs the control for selecting, when the wavelength measurement is again executed using the same measuring device 32 as in the previous measurement at a different temperature, the corresponding measuring section 30 with reference to the measuring section information stored in the storage means 18 is shown. In other words, in the second embodiment, an example in which the controller 52 selects the algorithm 2) when the measuring section 30 measures output of the object to be tested (DUT) 12 under different temperature is shown. Further, in the second embodiment, an example in which the wavelength measurement of the laser light output from the object to be tested 12 is asynchronously performed with respect to the temperature change of the object to be tested 12 is shown. However, the aspect of the invention is not limited thereto, and a configuration in which a different variable parameter is changed with respect to the object to be tested 12 and an arbitrary parameter is asynchronously measured with respect to the change of the variable parameter may be used.

Third Embodiment

Figure 9:
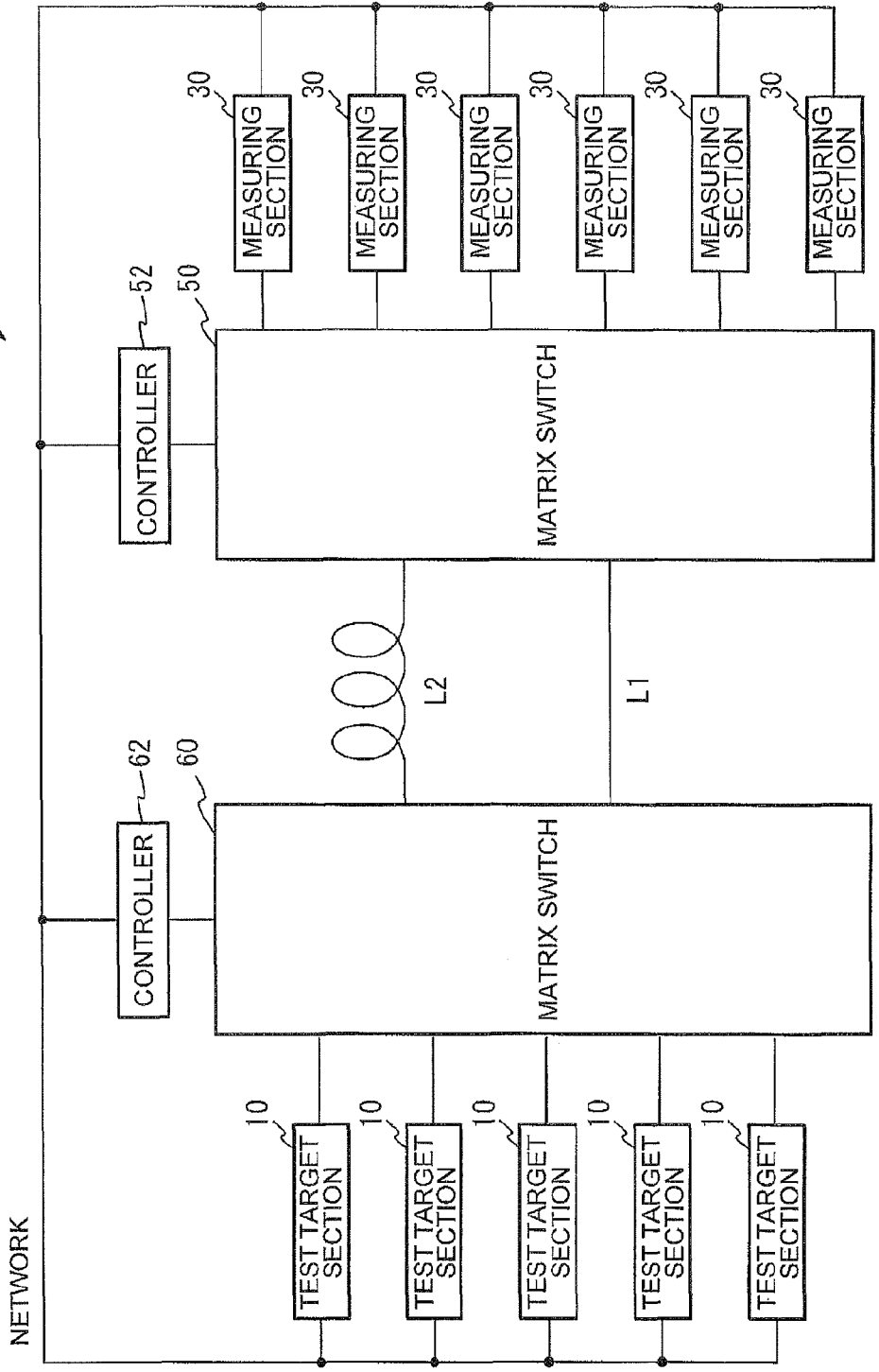
FIG. 9 is a block diagram illustrating an entire configuration of a test apparatus according to a third embodiment.

In the first and second embodiments, an example in which the wavelength of the laser light output from the object to be tested 12 is measured by the measuring device 32 is shown, but in a third embodiment, a case in which a power penalty of an optical signal output from the object to be tested 12 is measured by the measuring device 32 will be described. FIG. 9 is a block diagram illustrating an entire configuration of a test apparatus according to the third embodiment. As shown in FIG. 9, a test apparatus 300 according to the third embodiment includes a switch section 60 and a controller 62, in addition to the plural test target sections 10, the plural measuring sections 30, the switch section 50, and the controller 52.

The switch section 60 is a matrix switch, for example. The controller 62 includes a CPU, a ROM, a RAM, and the like, and controls the switch section 60. The switch section 60 connects the plural test target sections 10 to light transmission lines L1 and L2. The light transmission lines L1 and L2 are different in transmission distance. The transmission distance of the light transmission line L2 is longer than the transmission distance of the light transmission line L1. For example, the transmission distance of the light transmission line L2 is 100 km, and the transmission distance of the light transmission line L1 is approximately equal to zero (non-transmission) compared with the light transmission line L2. The light transmission lines L1 and L2 are connected to the switch section 50. The other configuration is the same as in the first embodiment shown in FIG. 1, and the description will not be repeated.

In the third embodiment, the power penalty of the optical signal output from the object to be tested 12 is measured by the measuring device 32. Accordingly, the object to be tested 12 is a semiconductor laser similar to the first embodiment, and the measuring device 32 serves as a receiver (for example, a bit error measuring device) that receives a signal for measuring a bit error rate, output from the object to be tested 12. The other configurations of the test target section 10 and the measuring section 30 are the same as in the first embodiment shown in FIGS. 2A and 2B, and the description will not be repeated. Further, a control method of the test apparatus 300 according to the third embodiment is also the same as in the first embodiment shown in the flowchart of the FIG. 3, and the description will not be repeated.

As in the third embodiment, even in a case where the bit error rates of the optical signals transmitted through the light transmission lines L1 and L2 having the different transmission distances are measured to calculate the power penalty, it is preferable to measure the optical signal output from the object to be tested 12 provided in one test target section 10 using the same measuring device 32. The reason is as follows.

Figure 10A:
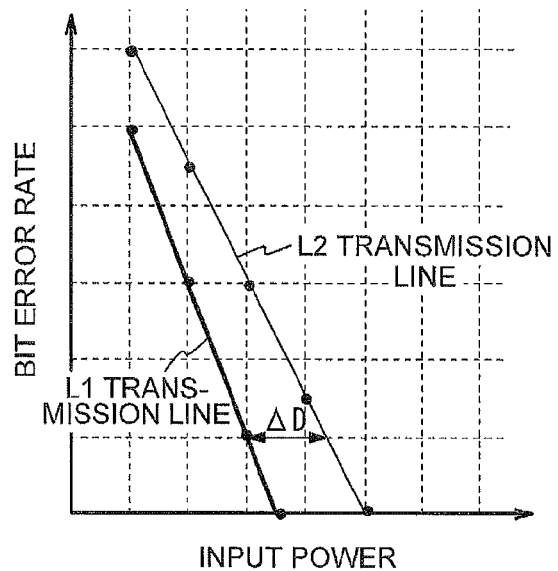
FIG. 10A is a diagram illustrating the relationship between input power of an optical signal input to a light transmission line and a bit error rate measured by a measuring device.
Figure 10B:
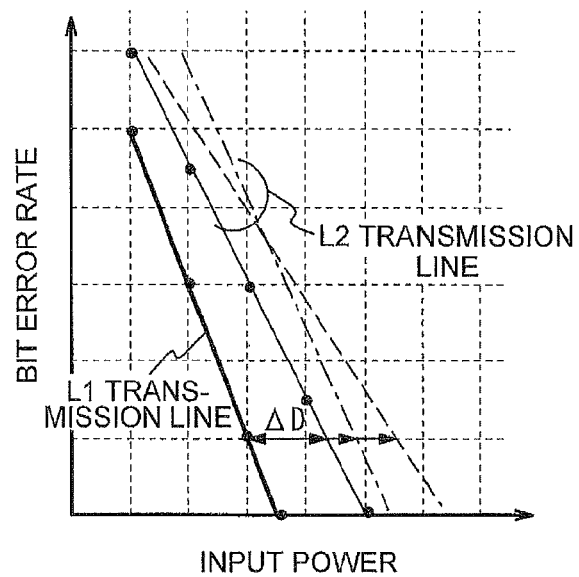
FIG. 10B is a diagram illustrating the relationship between input power of an optical signal input to a light transmission line and a bit error rate measured by a measuring device.

FIGS. 10A and 10B are diagrams illustrating the relationship between input power of the optical signals input to the light transmission lines L1 and L2 and the bit error rates measured by the measuring device 32.

A thick solid line in FIG. 10A represents a measurement result obtained by measuring the optical signal (that is, optical signal of non-transmission) that is output from the object to be tested 12 provided in the test target section A and is transmitted through the light transmission line L1 using the measuring section A. A thin solid line in FIG. 10A represents a measurement result obtained by measuring the optical signal (that is, optical signal after transmission of 100 km) that is output from the object to be tested 12 provided in the test target section A and is transmitted through the light transmission line L2 using the same measuring section A. As shown in FIG. 10A, in the optical signal transmitted through the light transmission line L1 and the optical signal transmitted through the light transmission line L2, the bit error rates with respect to the input power are different. By calculating an input power difference $\Delta D$ between the optical signal (that is, optical signal of non-transmission) transmitted through the light transmission line L1 and the optical signal (that is, optical signal after transmission of 100 km) transmitted through the light transmission line L2 at an arbitrary error rate point X, it is possible to calculate the power penalty.

FIG. 10B is a diagram in which measurement results obtained by measuring the optical signal (that is, optical signal after transmission of 100 km) that is output from the object to be tested 12 provided in the test target section A and is transmitted through the light transmission line L2 using measuring sections B and C different from the measuring section A are added to FIG. 10A. A broken line represents a measurement result obtained by measuring the optical signal using the measuring section B, and a single dot chain line represents a measurement result obtained by measuring the optical signal using the measuring section C. As shown in FIG. 10B, even in the same optical signal transmitted through the light transmission line L2, it can be understood that as the measuring section is changed, the bit error rate with respect to the input power is changed. It is considered that this change is caused due to an individual difference between the measuring devices. Here, in the optical signal (optical signal of non-transmission) transmitted through the light transmission line L1, although measured by the different measuring devices, the bit error rate with respect to the input power is barely changed. From these results, it can be understood that when the optical signal (optical signal of non-transmission) transmitted through the light transmission line L1 and the optical signal (optical signal after transmission of 100 km) transmitted through the light transmission line L2 using the different measuring sections 30, it is difficult to obtain the power penalty with high accuracy.

Accordingly, it can be understood that when measurement results based on the difference of measurement conditions are evaluated as relative values as in calculation of the power penalty, it is preferable that the same measuring section 30 be connected to one test target section 10 for measurement. Accordingly, as in the third embodiment, when the signal transmission distances between the test target section 10 and the measuring device 30 are different and the first and second measurements are performed, it is preferable to perform the control according to the flowchart shown in FIG. 3 so that the measurement is performed using the same measuring section 30. That is, when the test target section 10 executes again a measurement for the same object to be tested 12 using the same measuring device 32 as in the previous measurement through a different transmission line, it is preferable that the controller 52 perform a control for selecting the corresponding measuring section 30 with reference to the measuring section information stored in the storage means 18. In other words, it is preferable that the controller 52 selects the algorithm 2) when the measuring section 30 measures output of the object to be tested (DUT) 12 under different length of the path.

In the first to third embodiments, an example in which the object to be tested 12 provided in the test target section 10 is the semiconductor laser is shown, but the aspect of the invention is not limited thereto. For example, the object to be tested 12 may be a light receiving element other than the semiconductor laser. Further, the measuring item of the measuring section 30 may include one of a bit error rate, a wavelength, and an optical power.

Hereinbefore, the embodiments of the test apparatus according to one aspect of the invention are described in detail, but the aspect of the invention is not limited to such specific embodiments, and various modifications or changes may be made in a range without departing from the spirit of claims.

What is claimed is:

1. A test apparatus comprising:
   a plurality of test target sections each having a connector to connect a Device Under Test (DUT);
   a plurality of measuring sections that include measuring devices that have same measuring item respectively; and
   a switch section that switches connection between a test target section of the plurality of test target sections and a measuring section of the plurality of measuring sections under direction of a controller,
   wherein the controller is operable to select one of:
   1) searching vacancy of the plurality of measuring sections and directing the switch section to make a path between the test target section and a vacant measuring section from the plurality of measuring sections, or
   2) holding the path between the test target section and the measuring section, even if another path between the test target section and a vacant measuring section is possible, and performing another measurement between the test target section and the measurement section after the path with the test target section and the measuring section was released.

2. The test apparatus according to claim 1,
   wherein the controller selects holding the path when the measuring section measures output of the DUT under different temperature.

3. The test apparatus according to claim 1,
   wherein the measuring item includes one of a bit error rate, a wavelength, and an optical power.

4. The test apparatus according to claim 1,
   wherein the controller selects holding the path when the measuring section measures output of the DUT under different length of the path.

5. The test apparatus according to claim 1,
   wherein the switch section is a matrix switch that switches connection between the plurality of test target sections and the plurality of measuring sections.

* * * * *